United States Patent
Chen

[11] Patent Number: 5,831,290
[45] Date of Patent: Nov. 3, 1998

[54] LASER DIODE MOUNTING STRUCTURE

[75] Inventor: Kuo-Ti Chen, Taipei Hsien, Taiwan

[73] Assignee: Quarton, Inc., Taipei Hsien, Taiwan

[21] Appl. No.: 805,570

[22] Filed: Feb. 25, 1997

[51] Int. Cl.[6] .................................................. H01L 33/00
[52] U.S. Cl. ............................... 257/81; 257/82; 257/99; 257/680
[58] Field of Search .................................. 257/99, 81, 82, 257/680

[56] References Cited

U.S. PATENT DOCUMENTS

| | | | |
|---|---|---|---|
| 3,908,184 | 9/1975 | Anazawa et al. | 257/99 |
| 5,529,852 | 6/1996 | Sasame et al. | 428/620 |
| 5,574,959 | 11/1996 | Tsujioka et al. | 419/2 |
| 5,604,361 | 2/1997 | Isaksson | 257/99 |

FOREIGN PATENT DOCUMENTS 406090026A  3/1994  Japan ........................................ 257/99

*Primary Examiner*—William Mintel
*Attorney, Agent, or Firm*—Rosenberg, Klein & Bilker

[57] ABSTRACT

A laser diode mounting structure is provided that includes a base member, which can be a metal substrate or a diode, a metal binder, and a laser diode having a laser beam emitter. The laser diode is mounted on the base member over the metal binder, and welded to the base member by melting the metal binder. The metal binder may be a metal powder or a thin metal film.

4 Claims, 10 Drawing Sheets

LASER DIODE MOUNTING STRUCTURE

BACKGROUND OF THE INVENTION

The present invention relates to a laser diode mounting structure. More specifically, the present invention relates to a laser diode mounting structure which fastens a laser diode to a metal substrate or a second laser diode, by melting a fine metal powder or melting a thin metal layer therebetween.

PRIOR ART

FIGS. 1 and 2 show a laser diode mounting structure according to the prior art. According to this laser diode mounting structure, a connecting member 3 is fastened to a substrate 2 by silver glue 41, and a layer of indium 4 is coated on the top side of the connecting member 3 and then cut into lines by a precision processing apparatus. A laser diode 1 is welded to the indium layer 4 of the connecting member 3. This mounting structure is complicated. The application of the silver glue 41 and the coating of the indium layer 4 are not easy. This complicated laser diode mounting structure results in a high rate of defects being produced. Furthermore, the high cost of the indium layer 4 greatly increases the manufacturing cost of the laser diode mounting structure.

SUMMARY OF THE INVENTION

The present invention provides a laser diode mounting structure which eliminates the aforesaid drawbacks. According to one embodiment of the present invention, a laser diode is fastened to a metal substrate by melting a fine metal powder therebetween. According to a second embodiment of the present invention, a first laser diode is fastened to a second laser diode by melting a fine metal powder therebetween. According to a third embodiment of the present invention, a laser diode is fastened to a metal substrate by melting a thin metal layer therebetween.

DETAILED DESCRIPTION OF THE PREFERRED EMBODIMENT

Figure 1:
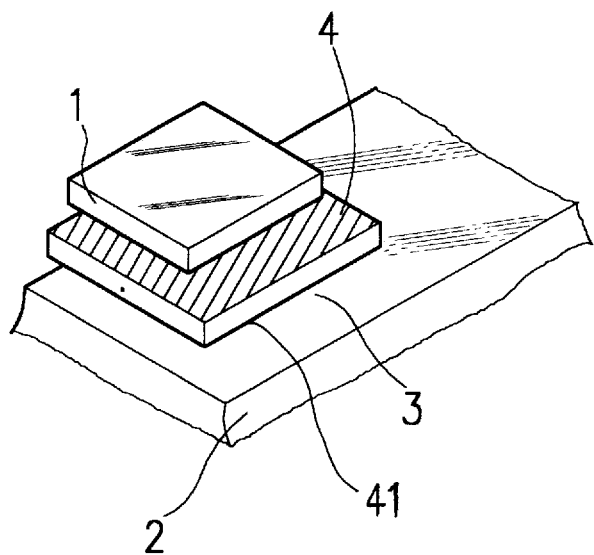
FIG. 1 shows a laser diode mounting structure according to the prior art (before welding)
Figure 2:
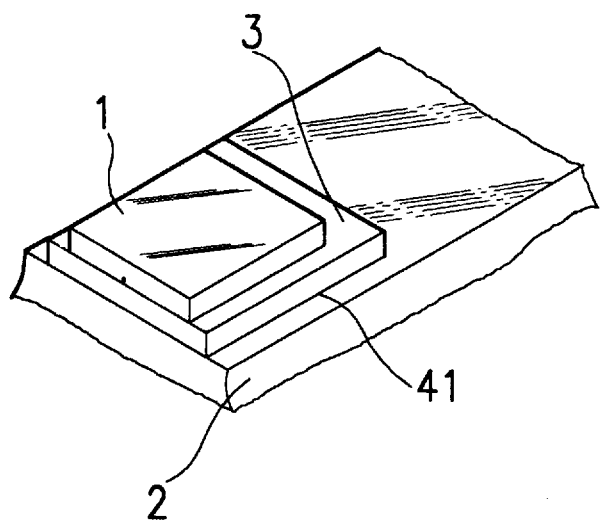
FIG. 2 is an elevational view of the laser diode mounting structure of FIG. 1 when welded.
Figure 3:
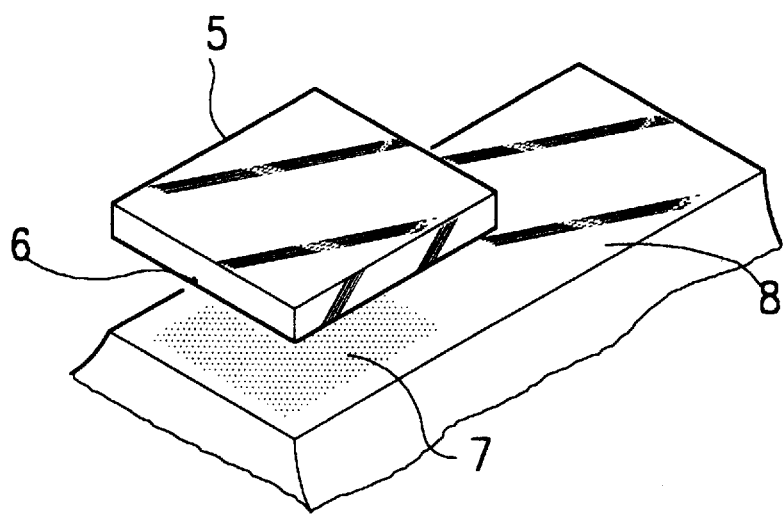
FIG. 3 is an exploded view of a laser diode mounting structure according to a first embodiment of the present invention.
Figure 4:
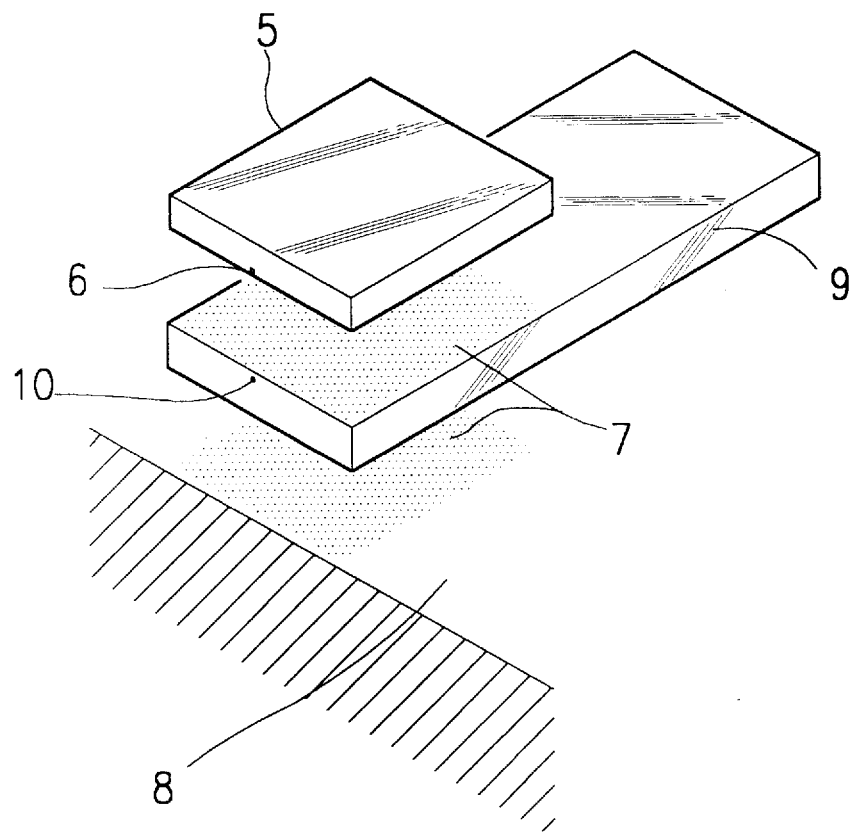
FIG. 4 is an exploded view of a laser diode mounting structure according to a second embodiment of the present invention.
Figure 5:
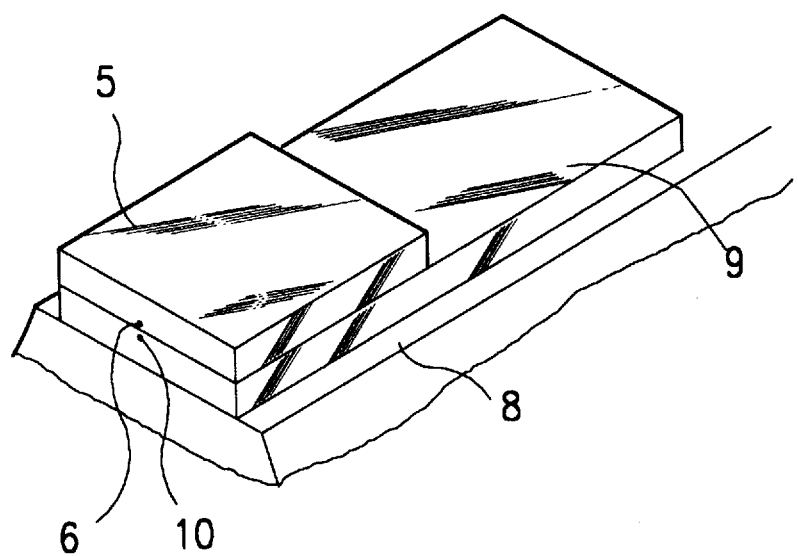
FIG. 5 is an elevational view of the laser diode mounting structure of FIG. 4 when installed.
Figure 6:
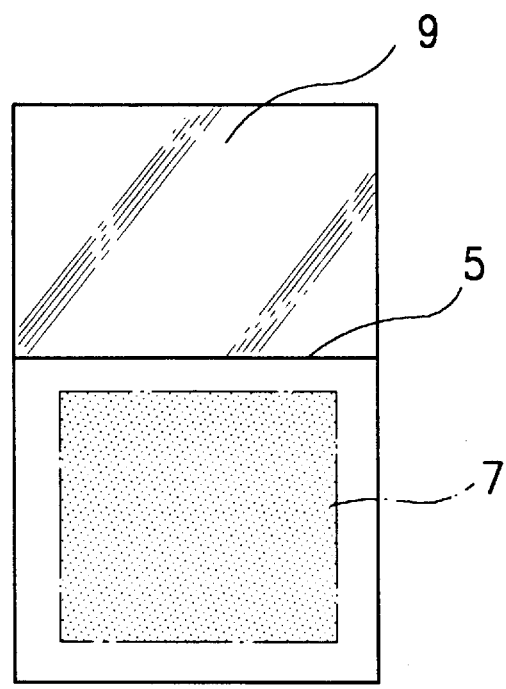
FIG. 6 is a top plan view of a part of the second embodiment of the present invention, showing the relationship of the binding substance between the laser diodes.
Figure 7:
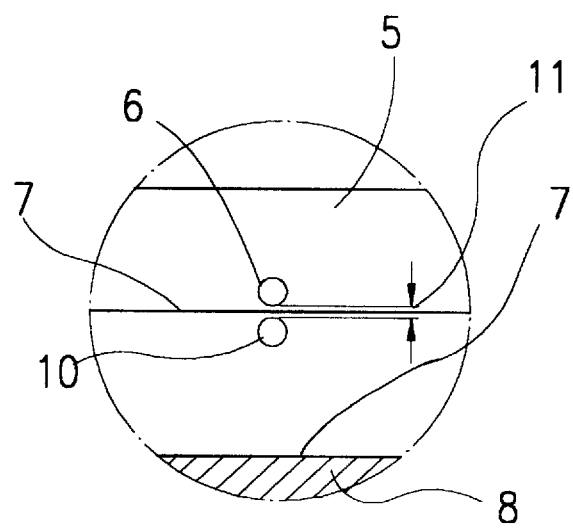
FIG. 7 is an enlarged view of a part of the front side of the second embodiment of the present invention, showing the distance between the laser beam emitters of the two laser diodes.
Figure 8:
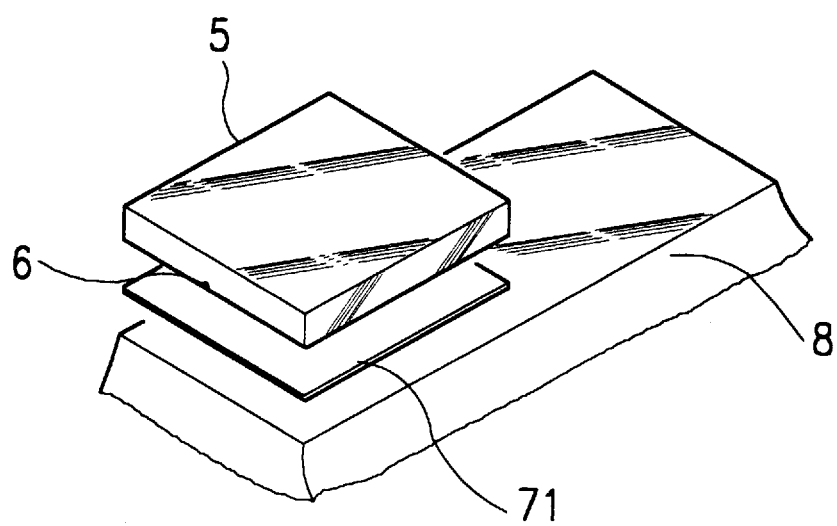
FIG. 8 is an exploded view of a laser diode mounting structure according to a third embodiment of the present invention.
Figure 9:
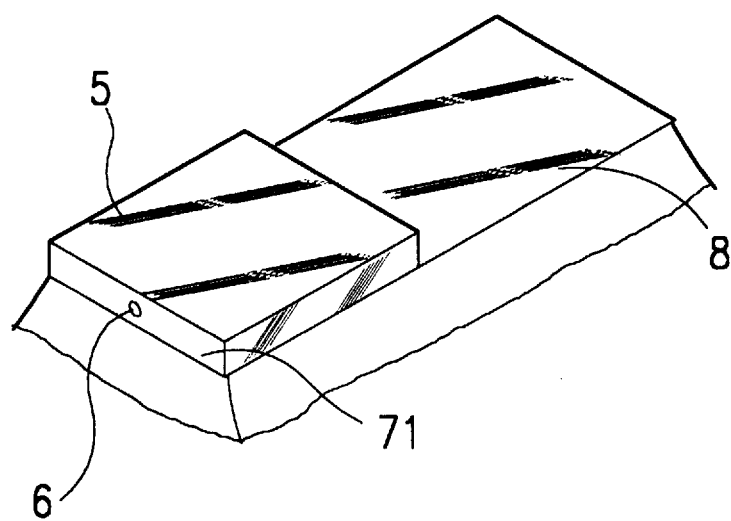
FIG. 9 is an elevational view of the third embodiment of the present invention.
Figure 10:
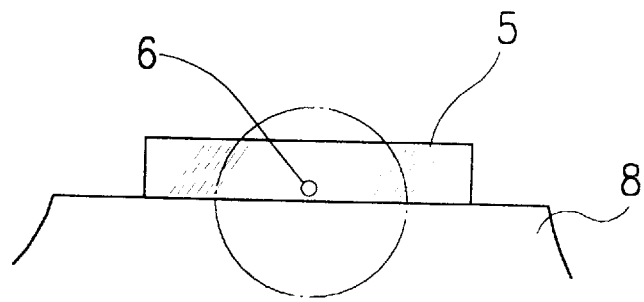
FIG. 10 is a front view of the third embodiment of the present invention.

Referring to FIG. 3, a laser diode 5 is provided having a laser beam emitter 6. A binding substance 7 is evenly spread over a substrate 8. The substrate 8 is made from metal. The binding substance 7 is a fine metal powder. The laser diode 5 is put on the substrate 8 over the binding substance 7, and then a certain temperature is applied to the substrate 8, causing the binding substance 7 to melt, thereby welding the laser diode 5 to the substrate 8.

Referring to FIGS. 4–7, a laser diode (the first laser diode) 5 is provided having a laser beam emitter 6. A second laser diode 9 is provided having a laser beam emitter 10. A binding substance (fine metal powder) 7 is spread over the top side of the second laser diode 9, then the first laser diode 5 is put on the second laser diode 9, over the binding substance 7. Then, a certain temperature is applied to the binding substance 7, causing the binding substance 7 to melt, thereby welding the laser diode 5 and the second laser diode 9 together. The second laser diode 9 may be welded to a metal substrate 8 in the same manner that it is welded to the first laser diode 5. When the first laser diode 5 and the second laser diode 9 are welded together, the distance 11 between the laser beam emitter 6 of the first laser diode 5 and the laser beam emitter 10 of the second laser diode 9 is as narrow as within 3 μm–5 μm.

Figure 11:
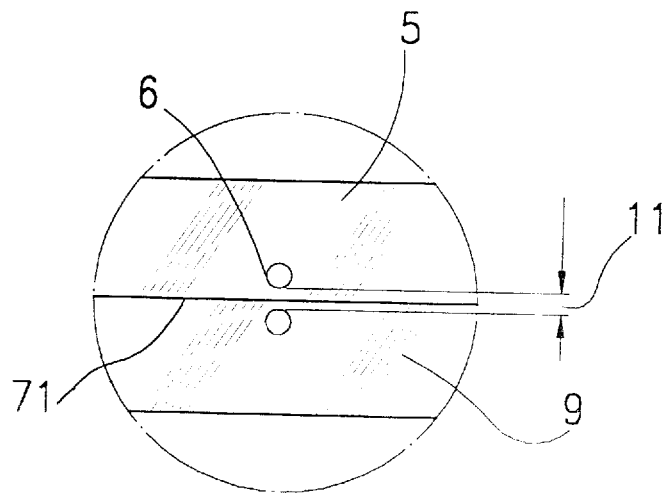
FIG. 11 is an enlarged view of the middle part of FIG. 10.

Referring to FIGS. 8–11, a thin metal binding film 71 is put on a metal substrate 8, then a laser diode 5 which has a laser beam emitter 6 is put on the thin metal binding layer 71 above the metal substrate 8. Subsequently, a certain temperature is employed to melt the thin metal binding layer 71, thereby welding the laser diode 5 to the metal substrate 8. Further, the thin metal binding layer can also be used for welding a first laser diode to a second laser diode, as shown in FIG. 11.

It is to be understood that the drawings are designed for purposes of illustration only, and are not intended as a definition of the limits and scope of the invention disclosed.

What the invention claimed is:

1. A laser diode mounting structure, comprising:
   a metal substrate;
   a laser diode joined to said metal substrate; and,
   a metal powder disposed between said laser diode and said metal substrate, said metal powder being heated to a predetermined temperature sufficient to melt and thereby form a bond between said laser diode and said substrate.

2. A laser diode mounting structure, comprising:
   a metal substrate;
   a laser diode joined to said metal substrate; and,
   a thin metal film disposed between said laser diode and said metal substrate, said thin metal film being heated to a predetermined temperature sufficient to melt and thereby form a bond between said laser diode and said substrate.

3. A laser diode mounting structure, comprising:
   a metal substrate;
   a first laser diode joined to said metal substrate, said first laser diode having a first laser beam emitting region;
   a first metal powder disposed between said laser diode and said metal substrate, said first metal powder being heated to a predetermined temperature sufficient to melt and thereby form a bond between said first laser diode and said substrate;

a second laser diode overlaying said first laser diode and joined thereto, said second laser diode having a second laser beam emitting region; and, a second metal powder disposed between said second laser diode and said first laser diode, said second metal powder being heated to a predetermined temperature sufficient to melt and thereby form a bond between said first laser diode and said second laser diode.

4. The laser diode mounting structure as recited in claim 3 where said second laser diode overlays and is joined to said first laser diode with said second laser beam emitting region spaced from said first laser beam emitting region by a dimension in the approximating range of $3\mu m$ to $5\mu m$.

* * * * *